United States Patent
Chung et al.

(10) Patent No.: US 11,799,304 B2
(45) Date of Patent: Oct. 24, 2023

(54) MODULAR HIGH PRECISION CHARGER/DISCHARGER SUBRACK ASSEMBLY STRUCTURE

(71) Applicant: WONIK PNE CO., LTD., Suwon (KR)

(72) Inventors: Dea Taek Chung, Seongnam (KR); Byung Hum Kim, Hwaseong (KR); Soo Yong Chae, Suwon (KR)

(73) Assignee: WONIK PNE CO., LTD., Suwon (KR)

( * ) Notice: Subject to any disclaimer, the term of this patent is extended or adjusted under 35 U.S.C. 154(b) by 0 days.

(21) Appl. No.: 16/972,722

(22) PCT Filed: Oct. 13, 2020

(86) PCT No.: PCT/KR2020/013904
§ 371 (c)(1),
(2) Date: Dec. 7, 2020

(87) PCT Pub. No.: WO2021/206242
PCT Pub. Date: Oct. 14, 2021

(65) Prior Publication Data
US 2023/0014801 A1    Jan. 19, 2023

(30) Foreign Application Priority Data
Apr. 9, 2020  (KR) .................. 10-2020-0043293

(51) Int. Cl.
*H02J 7/00* (2006.01)
*H01M 10/46* (2006.01)
*H02M 7/00* (2006.01)

(52) U.S. Cl.
CPC .......... *H02J 7/0045* (2013.01); *H01M 10/46* (2013.01); *H02J 7/0042* (2013.01); *H02M 7/003* (2013.01); *H02J 2207/20* (2020.01)

(58) Field of Classification Search
CPC .... H02J 7/0042; H02J 7/0045; H02J 2207/20; H01M 10/46; H02M 7/003
(Continued)

(56) References Cited

U.S. PATENT DOCUMENTS 9,000,612 B2 * 4/2015 Choi .................. H02J 3/381
                                                              307/64
9,214,822 B2   12/2015 Hartley et al.
(Continued)

FOREIGN PATENT DOCUMENTS

KR    1020120116733    10/2012
KR    1020130031204    3/2013
(Continued)

*Primary Examiner* — Edward Tso
*Assistant Examiner* — Aaron Piggush
(74) *Attorney, Agent, or Firm* — PATENTFILE, LLC; Bradley C. Fach; Steven R. Kick

(57) ABSTRACT

The present disclosure relates to a technical idea for efficiently using space of a power supply unit of a charging/discharging system by facilitating arrangement and design in a unit module. A modular high-precision charger/discharger sub-rack assembly structure includes: a base plate fixed in a state of being vertically erected to a sub-rack of a high precision charger/discharger; and at least one charger/discharger power supply unit or electrically or physically detachably attached to one surface of the base plate, configured to perform charging or discharging through bi-directional AC-DC conversion or bi-directional DC-DC conversion between a battery and a power source, including constituent circuits arranged in a first direction to have an elongated shape in the first direction and to perform charging or discharging, and arranged in parallel in a second direction perpendicular to the first direction on the base plate.

3 Claims, 6 Drawing Sheets

(58) Field of Classification Search
USPC .......................................... 320/107, 111, 140
See application file for complete search history.

(56) References Cited

U.S. PATENT DOCUMENTS

| | | | | |
|---|---|---|---|---|
| 2013/0293198 | A1* | 11/2013 | Nakashima | H02J 7/0016 |
| | | | | 320/134 |
| 2017/0117709 | A1* | 4/2017 | Svedendahl | H02J 9/061 |
| 2019/0081506 | A1* | 3/2019 | Chang | H02J 3/381 |
| 2019/0168630 | A1* | 6/2019 | Mrlik | B60L 53/51 |

FOREIGN PATENT DOCUMENTS

| | | |
|---|---|---|
| KR | 101262265 | 5/2013 |
| KR | 101378427 | 3/2014 |
| KR | 1020140131862 | 11/2014 |
| KR | 1020150110427 | 10/2015 |

\* cited by examiner (PRIOR ART)

210

220

MODULAR HIGH PRECISION CHARGER/DISCHARGER SUBRACK ASSEMBLY STRUCTURE

This Application is a 35 U.S.C. 371 National Stage Entry of International Application No. PCT/KR2020/013904 filed on Oct. 13, 2020, which claims the benefit of Republic of Korea Patent Application No. 10-2020-0043293, filed on Apr. 9, 2020, the entire disclosures of which are incorporated by reference herein.

BACKGROUND OF THE DISCLOSURE

Field of the Disclosure

The present disclosure relates to a technical idea for efficiently using space of a power supply unit of a charging/discharging system by facilitating arrangement and design in a unit module.

Related Art

Secondary batteries (or secondary cells), devices that convert electrical energy supplied from the outside into chemical energy and store the converted chemical energy, and convert the chemical energy back to electrical energy when necessary, refer to batteries which may be repeatedly used through charging that electric energy is converted into chemical energy and discharging in a reverse direction. In addition, unlike primary batteries (or primary cells) which are impossible to charge and thus used once and then discarded, secondary batteries, which may be repeatedly charged and discharged, expand in usage range even to hybrid vehicles and electric vehicles that have recently been commercialized, as well as to compact and lightweight electronic devices such as mobile phones, notebook computers, and digital cameras.

Among secondary batteries, lithium secondary batteries having a higher energy density per unit weight, being rapidly charged, and being excellent in preservation and life, as compared with other secondary batteries, tend to increase in use. Typically, upon being completely assembled, secondary batteries are mounted on a charger/discharger to achieve activation and undergo a formation (activation) process to give characteristics of the secondary batteries by repeating a charging and discharging process several times. The activated batteries are completed as usable batteries. In the formation process, positive and negative terminals of the batteries are brought into contact with positive and negative contact pins, respectively, and then a current required for charging and discharging is applied to the batteries through the contact pins.

Meanwhile, in order to manufacture and release secondary batteries such as lithium ion batteries and lithium polymer batteries, various processes such as an aging process, a charging/discharging process, an open circuit voltage (OCV) inspection, internal resistance (IR) inspection, grading, and the like are performed, and among them, in the charging/discharging process, manufactured secondary batteries repeatedly undergo a process of charging and discharging and are then released as products.

FIG. 1 shows a configuration of a power supply unit 110 used in a charger/discharger sub-rack structure 100 of the related art.

In the existing charger and discharger sub-rack structure 100, an overall system including the power supply unit 110 should be configured for testing.

In order to expand the number of channels in the existing charger/discharger sub-rack structure 100, it is necessary to redesign the sub-rack each time according to a change in the number of channels and to change capacity of an inverter.

SUMMARY OF THE DISCLOSURE

An object of the present disclosure is to improve current precision through structure optimization by a high-precision charger/discharger sub-rack structure.

Another object of the present disclosure is to provide an integrated power module which includes all of components of a charger/discharger power supply unit so as to be tested independently.

Another object of the present disclosure is to provide a structure in which a bi-directional AC-DC converter configured in a sub-rack is replaced with a bi-directional step-down DC-DC converter to enable conversion of use to a charger/discharger power supply unit for a DC grid.

Another object of the present disclosure is to change the number of channels by increasing the number of modules as necessary, because it acts as a charger/discharger power supply unit by itself.

Another object of the present disclosure is to facilitate design and arrangement of a unit module by reducing a volume compared with an existing case, thereby effectively using space of a power supply unit of a charging/discharging system.

In an aspect, a modular high-precision charger/discharger sub-rack assembly structure includes: a base plate fixed in a state of being vertically erected to a sub-rack of a high precision charger/discharger; and at least one charger/discharger power supply unit electrically or physically detachably attached to one surface of the base plate, configured to perform charging or discharging through bi-directional AC-DC conversion or bi-directional DC-DC conversion between a battery and a power source, including constituent circuits arranged in a first direction to have an elongated shape in the first direction and to perform charging or discharging, and arranged in parallel in a second direction perpendicular to the first direction on the base plate.

The charger/discharger power supply unit may include an AC grid; a bi-directional AC-DC converter configured to perform bi-directional power conversion between the AC grid and a bi-directional DC-DC converter; a bi-directional DC-DC converter configured to charge or discharge the battery; and a jig physically connecting the bi-directional DC-DC converter and the battery, wherein the AC grid, the bi-directional AC-DC converter, the bi-directional DC-DC converter, and the jig are arranged on a printed circuit board (PCB) channel to have an elongated shape sequentially arranged in series in the first direction.

The charger/discharger power supply unit may include: a DC grid; a first bi-directional DC-DC converter configured to convert an input having a high voltage transferred from the DC grid into a bi-directional form as a low voltage DC appropriate for a second bi-directional DC-DC converter and to provide the converted power; a second bi-directional DC-DC converter configured to charge or discharge the power-converted low voltage DC battery; and a jig physically connecting the second bi-directional DC-DC converter and the battery, wherein the DC grid, the first bi-directional AC-DC converter, the second bi-directional DC-DC converter, and the jig are arranged on a PCB channel to have an elongated shape sequentially arranged in series in the first direction.

In the high precision charger/discharger sub-rack assembly structure, a controller may be disposed on the other surface of the base plate.

The high-precision charger/discharger sub-rack assembly structure may further include a partition disposed between different base plates.

DESCRIPTION OF EXEMPLARY EMBODIMENTS

Figure 1:
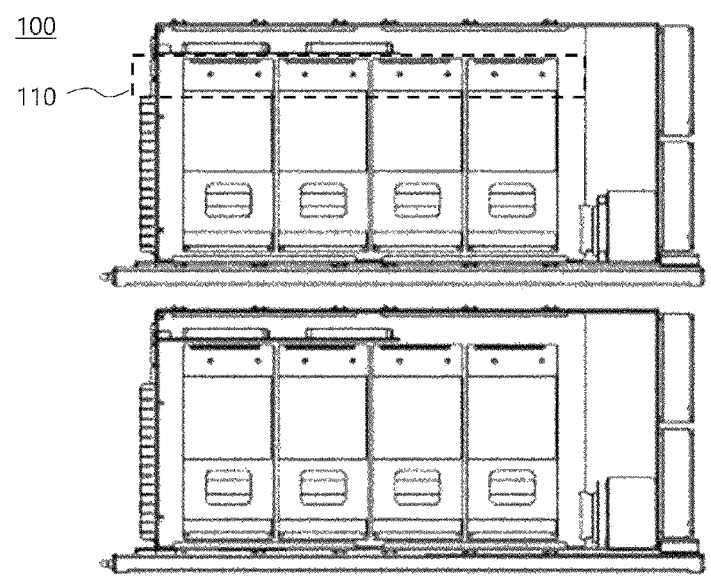
FIG. 1 shows a configuration of a power supply unit used in a charger/discharger sub-rack structure of the related art.

While a specific structural or functional description with respect to embodiments according to the present disclosure disclosed in this specification is merely provided for the purpose of describing the embodiments of the present disclosure, there are various modifications capable of replacing the embodiments, and the present disclosure is not limited to the embodiments described in this specification.

While the embodiments according to the present disclosure is susceptible to various modifications and alternative forms, specific embodiments thereof are shown by way of examples in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the invention.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the inventive concept.

It will be understood that when an element is referred to as being "connected" or "coupled" to another element, it can be directly connected or coupled to the other element or intervening elements may be present. In contrast, it will be understood that when an element is referred to as being "directly connected" or "directly coupled" to another element, there are no intervening elements present. Other expressions describing a relation between elements, that is, "between" and "directly between", or "adjacent to" and "directly adjacent to", etc. should be similarly understood.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms used herein including the technical or scientific terms have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in detail with reference to the accompanying drawings. However, the scope of the present disclosure is not limited by those embodiments. The same constituent elements in the drawings are denoted by the same reference numerals.

Figure 2A:
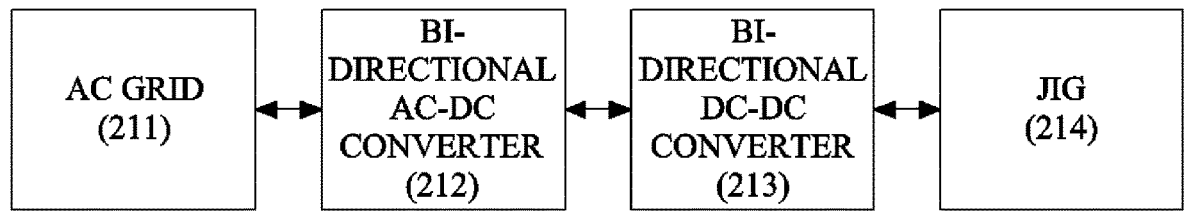
FIGS. 2A and 2B are block diagrams of a power supply unit of a high-precision charger/discharger sub-rack structure according to an embodiment of the present disclosure.
Figure 2B:
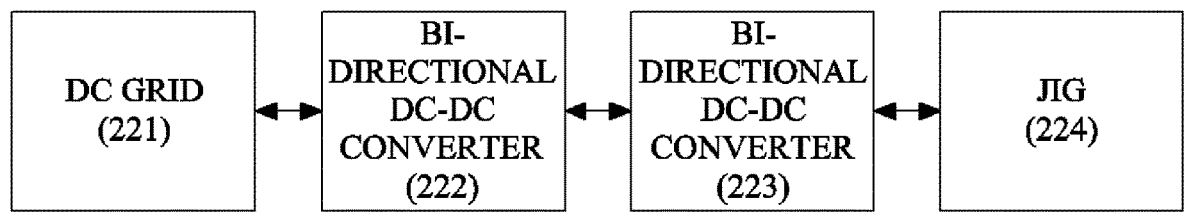

FIGS. 2A and 2B are block diagrams illustrating a power supply unit of a high-precision charging/discharging sub-rack structure according to an embodiment of the present disclosure.

In particular, the high-precision charger/discharger sub-rack assembly structure according to the present disclosure may include a base plate and a charger/discharger power supply unit detachably attached to one surface of the base plate.

The charger/discharger power supply unit is electrically or physically detachably attached to one surface of the base plate to perform charging and discharging through AC-DC conversion or DC-DC conversion between a battery and a power source. In addition, constituent circuits for processing charging/discharging may be arranged in a first direction to have an elongated shape in the first direction.

First, referring to FIG. 2A, a charger/discharger power supply unit 210 according to an embodiment may be utilized when a process of converting AC into DC is required for charging and discharging and include an AC grid 211, a bi-directional AC-DC converter 212, a bi-directional DC-DC converter 213, and a jig 214.

The bi-directional AC-DC converter 212 performs a function of bi-directional power conversion between the AC grid 211 and the bi-directional DC-DC converter 213.

The bi-directional DC-DC converter 213 is responsible for charging or discharging the battery, and the jig 214 may physically connect the bi-directional DC-DC converter 213 and the battery.

Meanwhile, the AC grid 211, the bi-directional AC-DC converter 212, the bi-directional DC-DC converter 213, and the jig 214 may be arranged on a PCB channel to have an elongated shape sequentially arranged in series in the first direction.

At least one charger/discharger power supply unit 210, preferably, a plurality of charger/discharger power supply units 210, may be arranged on the base plate.

Here, the base plate may be disposed in parallel in a second direction perpendicular to the first direction.

The first direction and the second direction may be directions extending in axes perpendicular to each other, such as an x-axis or a y-axis, on a plane formed as a base plate.

Next, FIG. 2B may correspond to a charger/discharger power supply unit 220 when the process of converting AC into DC is not required for charging and discharging and may include a DC grid 221, a bi-directional DC-DC converter 222, a bi-directional DC-DC converter 223, and a jig 224.

The charger/discharger power supply unit 220 may include the bi-directional DC-DC converter 222 that converts an input having a high voltage transferred from the DC grid 221 into a bi-directional form as a low voltage DC appropriate for the bi-directional DC-DC converter 223 and provides the same.

In addition, the bi-directional DC-DC converter 223 may serve to charge or discharge a power-converted low voltage DC battery.

Meanwhile, the jig 224 may perform a function of physically connecting the bi-directional DC-DC converter 223 and the battery.

The charger/discharger power supply unit 220 according to an embodiment may include the DC grid 221, the bi-directional DC-DC converter 222, the bi-directional DC-DC converter 223, and the jig 224 and may be arranged on a PCB channel to have an elongated shape sequentially arranged in series in the first direction.

Similarly, at least one charger/discharger power supply unit, preferably, a plurality of charger/discharger power supply units 220, may be arranged on the base plate and may be arranged in parallel in the second direction perpendicular to the first direction on the base plate.

Figure 3:
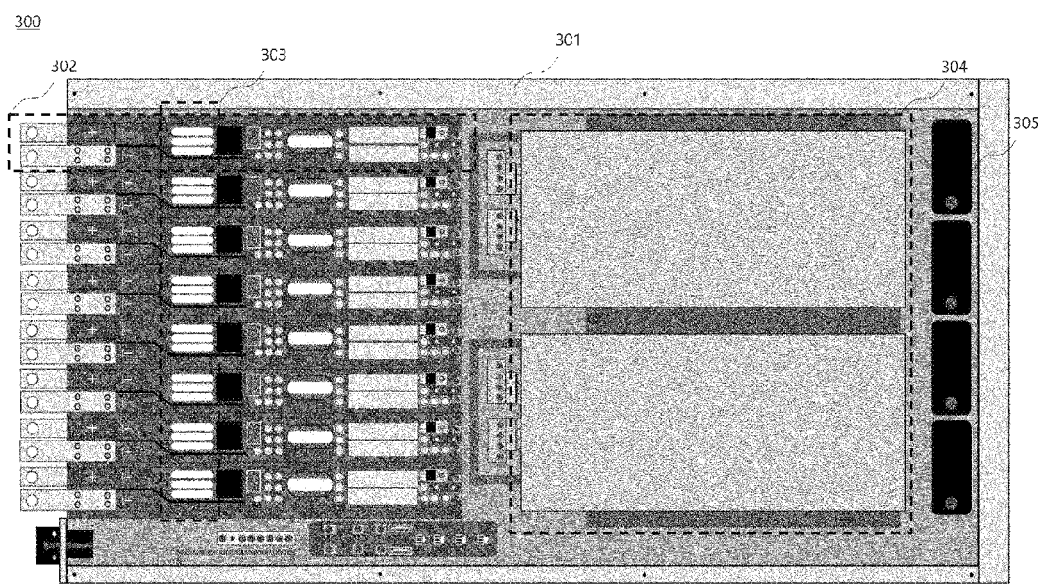
FIG. 3 shows a charger/discharger power supply unit to which a PCB channel is attached.

FIG. 3 shows a charger/discharger power supply unit 300 to which a PCB channel 302 is attached.

To this end, the high-precision charger/discharger sub-rack assembly structure may include one charger/discharger power supply unit disposed such that constituent circuits including the PCB channel 302 are attached to one surface of the base plate 301.

In addition, one charger/discharger power supply unit 300 may be erected vertically in the sub-rack of the high-precision charger/discharger, and in this state, several charger/discharger power supply units may be mounted in layers.

Preferably, one charger/discharger power supply unit 300 with eight PCB channels 302 attached thereto may perform the function of the bi-directional DC-DC converter.

The bi-directional DC-DC converter disposed on the PCB channel may be implemented in the form of a PCB channel 302 and may be formed in an elongated shape in the first direction, and a plurality of the bi-directional DC-DC converters may be arranged in parallel in the second direction perpendicular to the first direction.

Meanwhile, as denoted by reference numeral 303, a shunt may be disposed in the second direction perpendicular to the first direction of the PCB channel to reduce an error range of a temperature difference so that a current may flow precisely.

Reference numeral 304 corresponds to a bi-directional AC-DC converter and may perform bi-directional power conversion between an AC grid and a bi-directional DC-DC converter.

Reference numeral 305 may serve as a FAN to lower a temperature in order to prevent the charger/discharger power supply unit 300 from being overheated.

Figure 4A:
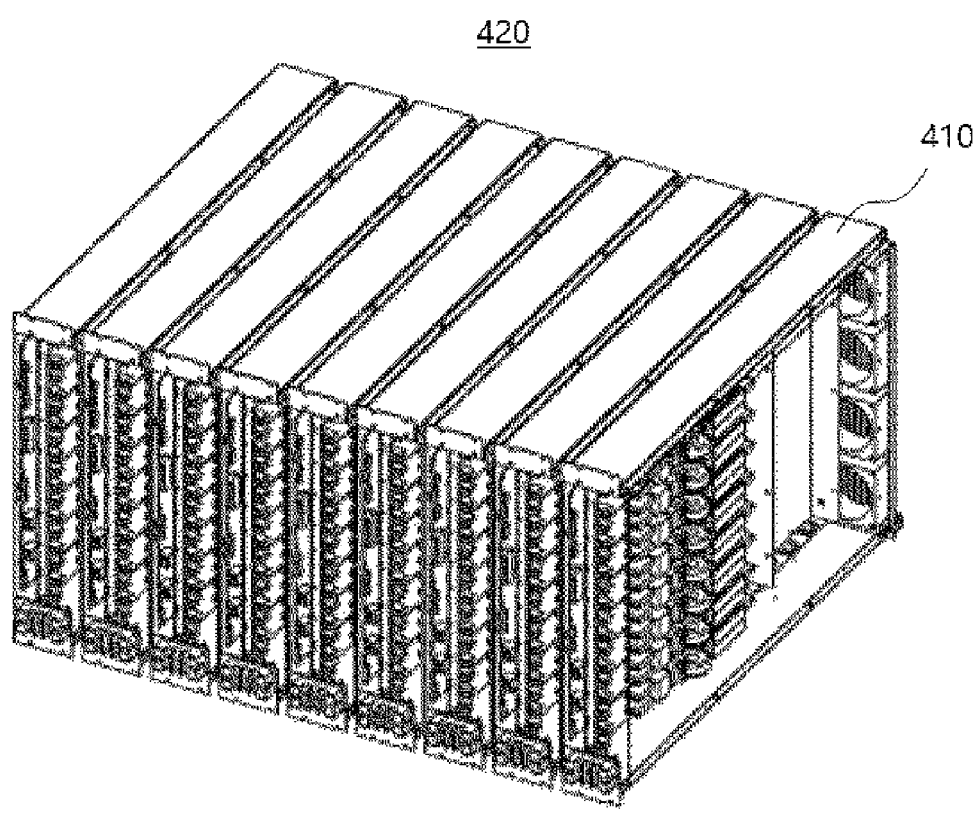
FIGS. 4A to 4B illustrate a charger/discharger power supply unit of a sub-rack structure to which a PCB channel is attached.
Figure 4B:
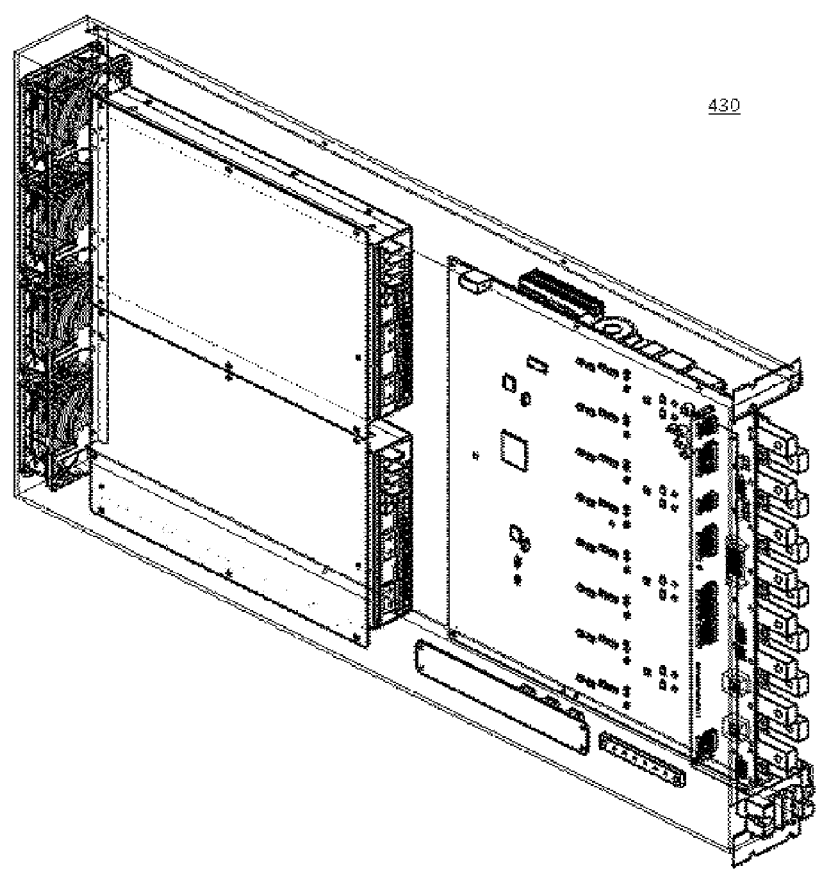

FIGS. 4A to 4B are views illustrating a charger/discharger power supply unit of a sub-rack structure to which a PCB channel is attached.

In addition, as shown in FIG. 4A, in one sub-rack structure of the high-precision charger/discharger, nine charger/discharger power supply units 410 may be arranged side by side in a parallel structure, thereby improving space efficiency.

In this case, a partition may be disposed between different base plates of the charger/discharger power supply units 410 to perform a shielding function.

FIG. 4B is an embodiment 430 showing one surface on which the charger/discharger power supply unit 410 is disposed and the other surface opposite thereto based on the base plate.

A controller may be mounted on the other surface of the base plate, and the charger/discharger power supply unit 410 and the controller may be disposed on mutually opposite surfaces based on the base plate.

In this manner, a problem in which an overall system should be configured for testing in the charger and discharger configuration of the related art may be solved. That is, in the sub-rack structure of the high-precision charger/discharger according to the present disclosure, the charger/discharger power supply unit 410 may be tested alone.

In addition, the bi-directional AC-DC converter configured in the sub-rack may be replaced with a bi-directional step-down DC-DC converter so as to be used as a charger/discharger power supply unit for a DC grid.

In addition, in the charger/discharger of the related art, it is necessary to redesign the sub-rack and change capacity of an inverter each time according to a change in the number of channels in order to increase the number of channels.

However, in the high-precision charger/discharger sub-rack structure of the present disclosure, since the charger/discharger power supply unit 410 may function by itself, the number of channels may be changed by increasing the number of modules as necessary.

In other words, it is easy to arrange and design the charger/discharger power supply unit 410 as a unit module, so that space of the power supply unit of the charging/discharging system may be efficiently used, and thus a volume may be significantly reduced compared to the existing case.

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

According to an embodiment, current precision may be improved through structure optimization by the high-precision charger/discharger sub-rack structure.

According to an embodiment, it is possible to provide the integrated power module that can be independently tested since it includes all the components of the charger/discharger power supply unit.

According to an embodiment, a structure in which the bi-directional AC-DC converter configured in the sub-rack is replaced with a bi-directional step-down DC-DC converter to enable conversion of use to a charger/discharger power supply unit for a DC grid.

According to an embodiment, since it acts as a charger/discharger power supply unit by itself, the number of channels may be changed by increasing the number of modules as necessary.

According to an embodiment, since a volume can be reduced compared to the existing case, it is easy to design and arrange a unit module, so that space of the power supply unit of the charging/discharging system can be efficiently used.

What is claimed is:

1. A modular charging/discharging system comprising:
a base plate; and
a plurality of charger/discharger power supply units electrically or physically detachably attached to one surface of the base plate, configured to perform charging or discharging through bi-directional AC-DC conversion and bi-directional DC-DC conversion between a battery and a power source, including constituent circuits arranged in a first direction to have an elongated shape in the first direction and to perform charging or discharging, and arranged in parallel in a second direction perpendicular to the first direction on the base plate,
wherein the plurality of charger/discharger power supply units include a first charger/discharger power supply unit for AC to DC conversion and a second charger/discharger power supply unit for DC to DC conversion,
wherein the first charger/discharger power supply unit includes:
a connection to an AC grid;
a bi-directional AC-DC converter configured to perform bi-directional power conversion between the connection and a bi-directional DC-DC converter; and
a bi-directional DC-DC converter configured to charge or discharge the battery;
wherein the connection, the bi-directional AC-DC converter and the bi-directional DC-DC converter are arranged on a printed circuit board (PCB) channel to have an elongated shape sequentially arranged in series in the first direction,
wherein the second charger/discharger power supply unit includes:
a connection to a DC grid;
a first bi-directional DC-DC converter configured to convert an input having a high voltage transferred from the connection into a bi-directional form as a low voltage DC appropriate for a second bi-directional DC-DC converter and to provide the converted power; and
a second bi-directional DC-DC converter configured to charge or discharge the battery with the low voltage DC converted by the first bi-directional DC-DC converter;
wherein the connection, the first bi-directional AC-DC converter and the second bi-directional DC-DC converter are arranged on a PCB channel to have an elongated shape sequentially arranged in series in the first direction.

2. The modular charging/discharging system of claim 1, wherein a controller is disposed on the other surface of the base plate.

3. The modular charging/discharging system of claim 1, further comprising:
a partition disposed between different base plates.

* * * * *